United States Patent
Libera et al.

(10) Patent No.: US 6,414,349 B1
(45) Date of Patent: Jul. 2, 2002

(54) HIGH EFFICIENCY MEMORY DEVICE

(75) Inventors: Giovanna Dalla Libera, Monza;
Matteo Patelmo, Trezzo Sull' Adda;
Bruno Vajana, Bergamo; Nadia Galbiati, Seregno, all of (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 09/517,636

(22) Filed: Mar. 3, 2000

(30) Foreign Application Priority Data

Mar. 3, 1999 (EP) .............................. 99830111

(51) Int. Cl.[7] ..................... H01L 29/76; H01L 29/788
(52) U.S. Cl. .................. 257/314; 257/315; 257/316; 257/317; 257/321
(58) Field of Search .................. 257/314–317, 257/321; 438/257, 263, 264

(56) References Cited

U.S. PATENT DOCUMENTS 4,868,619 A * 9/1989 Mukherjee et al. ......... 257/300

FOREIGN PATENT DOCUMENTS

| EP | 678921 A1 | 10/1995 |
|---|---|---|
| JP | 04179167 | 6/1992 |
| JP | 07086438 | 3/1995 |
| JP | 07297303 | 11/1995 |

\* cited by examiner

Primary Examiner—Tom Thomas
Assistant Examiner—Thien F Tran
(74) Attorney, Agent, or Firm—Lisa K. Jorgenson; E. Russell Tarleton; Seed IP Law Group PLLC

(57) ABSTRACT

To increase the facing surface and thus the coupling between the floating gate and control gate regions of a memory cell, the floating gate and control gate regions have a width that is not constant in different section planes parallel to a longitudinal section plane extending through the source and drain regions of the cell. In particular, the width of the floating gate and control gate regions is smallest in the longitudinal section plane and increases linearly in successive parallel section planes moving away from the longitudinal section plane.

18 Claims, 3 Drawing Sheets

HIGH EFFICIENCY MEMORY DEVICE

TECHNICAL FIELD

The invention relates to a high efficiency memory device, particularly of EEPROM type.

BACKGROUND OF THE INVENTION

As known, in electronics there is currently a demand for memory devices having ever-larger storage capacities without being of larger dimensions; this creates a demand for progressive miniaturization of the devices.

Consequently, manufacturing processes are being designed that enable the dimensions of the memory cells, particularly of EEPROM type, to be reduced; the lithographic processes for defining the various regions forming the cells do not, however, enable the dimensions of the cells to be reduced beyond a certain limit. Furthermore, the reduction of the area of each cell involves a similar reduction of the facing areas between the floating gate and control gate regions; consequently the coupling coefficient between these two gate regions is reduced, causing lower programming efficiency. This lower efficiency thus requires that the programming voltage be increased; this cannot, however, be increased beyond a certain limit, to prevent the risk of breakage of the cells.

SUMMARY OF THE INVENTION

The disclosed embodiments of the invention provide a memory device that overcomes the above drawbacks and, in particular, enables the facing area between the floating gate and control gate regions, and therefore the programming efficiency, to be increased.

The memory device includes at least one first memory cell having a memory transistor; the memory transistor having a first and a second gate region overlaid to each other and mutually insulated. The first and second gate region are arranged over and insulated from a substrate of semiconductor material of a first conductivity type. The memory transistor further includes a first and a second conductive region of a second conductivity type, both formed in the substrate respectively on a first and a second side of the first and second gate regions. The first and second gate regions and first and second conductive regions are mutually aligned along a longitudinal section plane. The second gate region has a non-constant width in different section planes parallel to the longitudinal section plane.

BRIEF DESCRIPTION OF THE DRAWINGS

For an improved understanding of the invention a preferred embodiment will now be described, purely by way of non-exhaustive example, with reference to the accompanying drawings, wherein.

DETAILED DESCRIPTION OF THE INVENTION

For a greater understanding of the features of the invention and the differences with current solutions, an EEPROM memory of known type comprising a plurality of memory cells aligned in rows and columns and forming an array will first be described.

Figure 1:
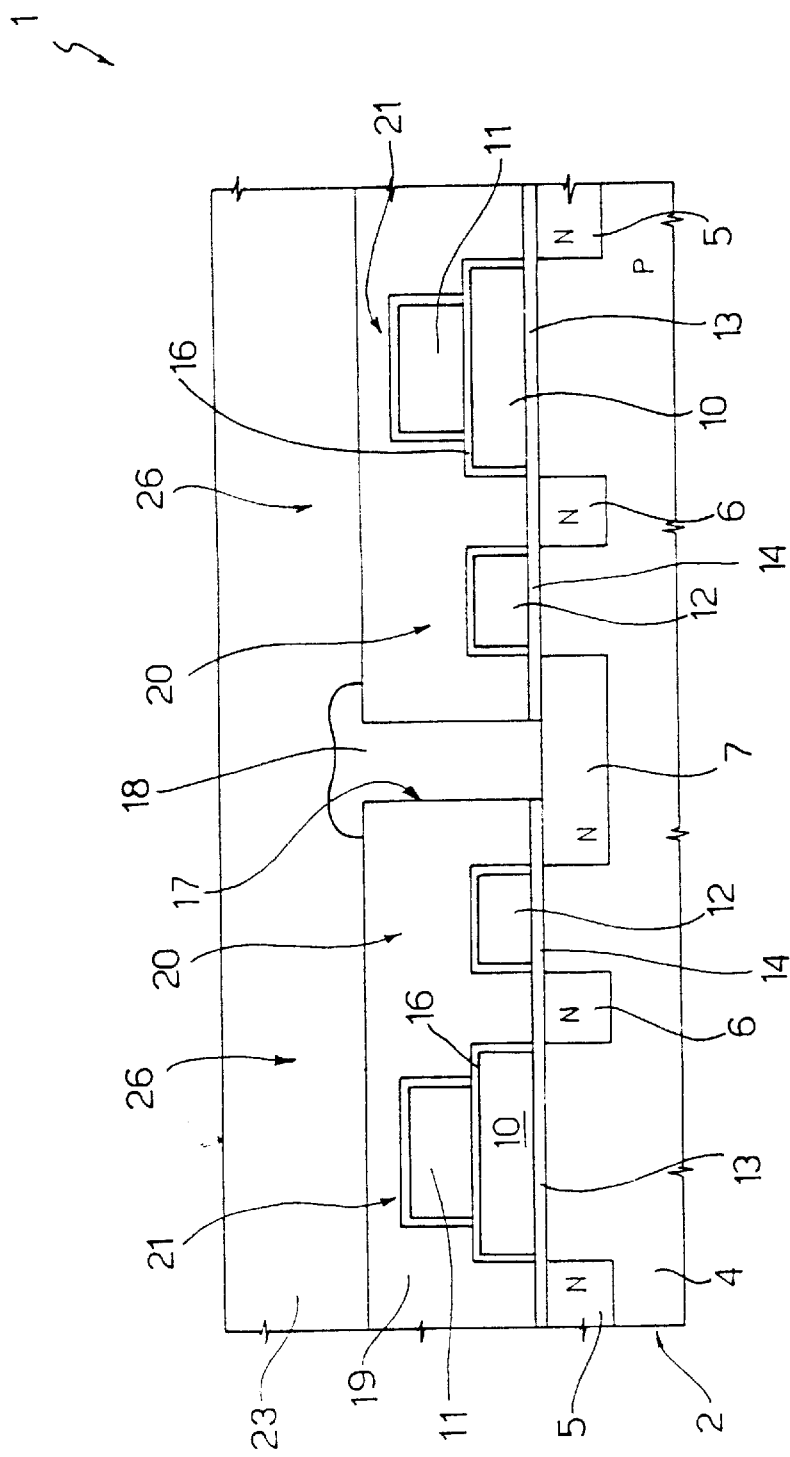
FIG. 1 shows a cross-section of a wafer incorporating a known memory device, taken along a line I—I of FIG. 2.
Figure 2:
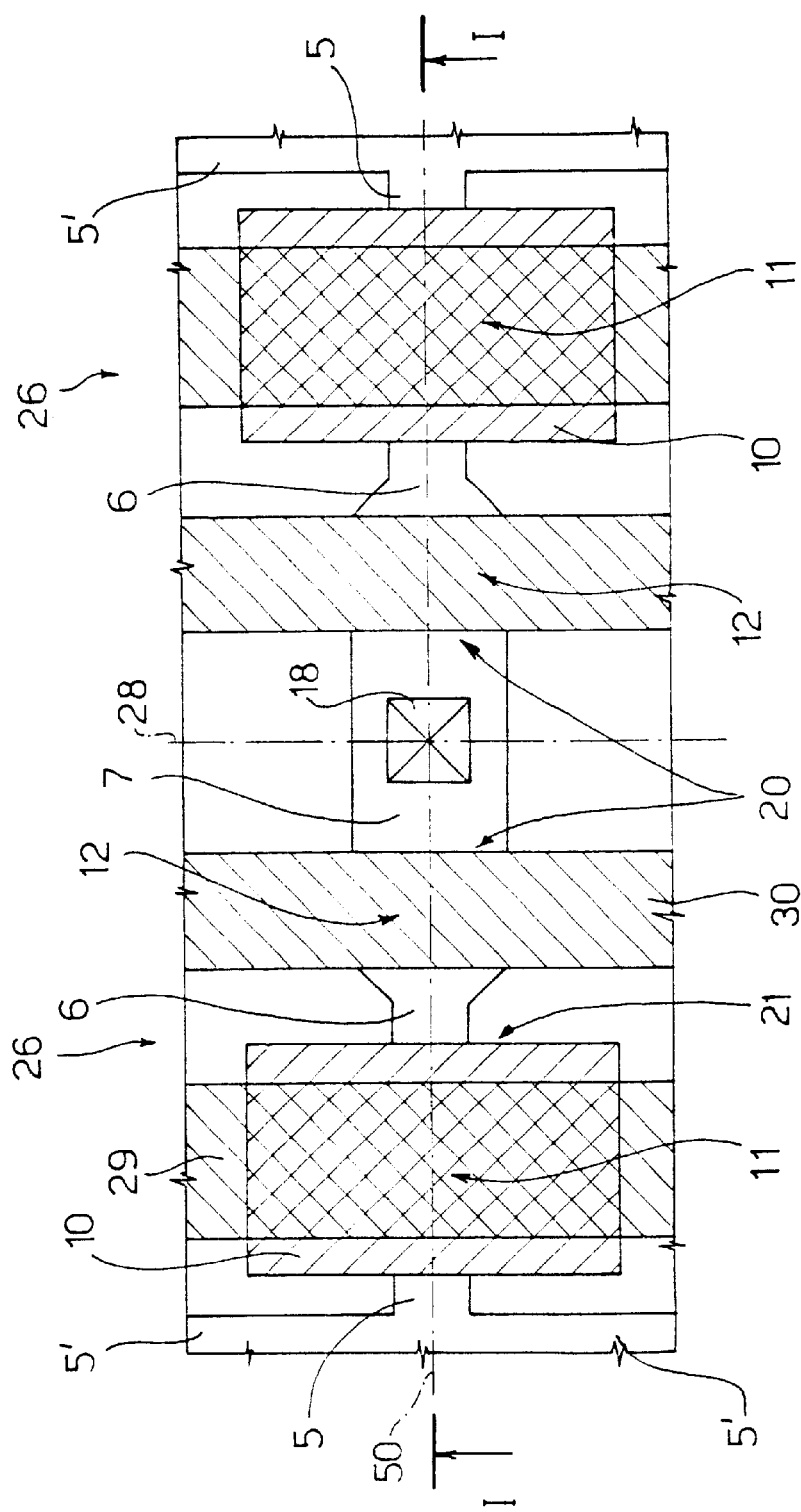
FIG. 2 shows a top view of the wafer of FIG. 1.

In particular, FIGS. 1 and 2 show a portion of a memory device 1 of known type comprising a pair of memory cells 26 formed in a wafer 2 of semiconductor material and arranged specularly with respect to a symmetry plane represented in FIG. 2 by a transverse direction 28. As shown in FIG. 1, each memory cell comprises a selection transistor 20 and a memory transistor 21.

Wafer 2 comprises a substrate 4 of single-crystal silicon, P-type in this case, housing N-type conductive regions 5–7 and surmounted by multi-crystal silicon regions 10–12. In detail, each memory transistor 21 comprises a floating gate region 10 and a control gate region 11, one over the other, insulated by an interpoly dielectric layer 16. The floating gate region 10 is arranged over the substrate 2 and is isolated therefrom by a gate oxide region 13. Each memory transistor 21 further comprises a first conductive region 6, forming a drain region, and a second conductive region 5, forming a source region, both arranged in the substrate 2 on a first and on a second side of the control gate 11 and floating gate 10 regions. As can be seen in particular in FIG. 2, the control gate 11, floating gate 10 regions, the first and the second conductive region 6 and 5 are aligned along an axis 50 coincident with line I—I of FIG. 2, coincident to the longitudinal section plane of FIG. 1.

In turn each selection transistor 20 is formed by a selection gate region 12, of multi-crystal silicon, extending over the substrate 2 and insulated therefrom by a gate oxide region 14. The first conductive region 6, forming the source region of the selection transistor 20, and a third conductive region 7, forming the drain region of the selection transistor 20, are arranged on the two sides of the selection gate region 12, inside the substrate 2. The third conductive region 7 is common to two selection transistors 20 belonging to a pair of cells 26 arranged symmetrically with respect to each other, as shown in FIG. 1.

A protective dielectric layer 19 extends over substrate 2 and is interrupted only at the contacts. In particular, as shown in FIG. 1, the protective dielectric layer 19 has an opening 17 housing a contact region 18, of metal material, extending down to the third conductive region 7 for biasing it. Finally a passivation layer 23 extends over the protective dielectric layer 19.

In the shown example, concerning a completely non-self-aligned process with T-shaped cells, the floating gate regions 10 have a width, measured in a direction parallel to axis 50, which is always constant and greater than the control gate regions 11, and the second conductive regions 5 comprise portions 5' extending in a transverse direction with respect to the longitudinal section plane (parallel to the transverse direction 28 of FIG. 2) to directly connect to similar portions 5' of second conductive regions 5 of adjacent cells, located over and under the cells 26 shown in FIG. 2.

In detail, as can be seen in FIG. 2, the floating gate regions 10 of the memory transistors 21 have a rectangular shape, the larger sides whereof extend parallel to the transverse direction 28. The control gate regions 11 are formed by strips 29 of polysilicon extending parallel to the transverse direction 28 and having constant width (here, the term width indicates the dimension measured parallel to axis 50 of FIG. 2). The first and second conductive regions 6, 5 are aligned with the floating gate regions 10 of the memory transistors 21 and the first and third conductive regions 6, 7 are aligned with the selection gate regions 12 of the selection transistors 20.

The selection gate regions 12 of the selection transistors 20 are formed by strips 30 of polysilicon also extending parallel to the transverse direction 28 and having a constant dimension in the direction of axis 50.

Figure 3:
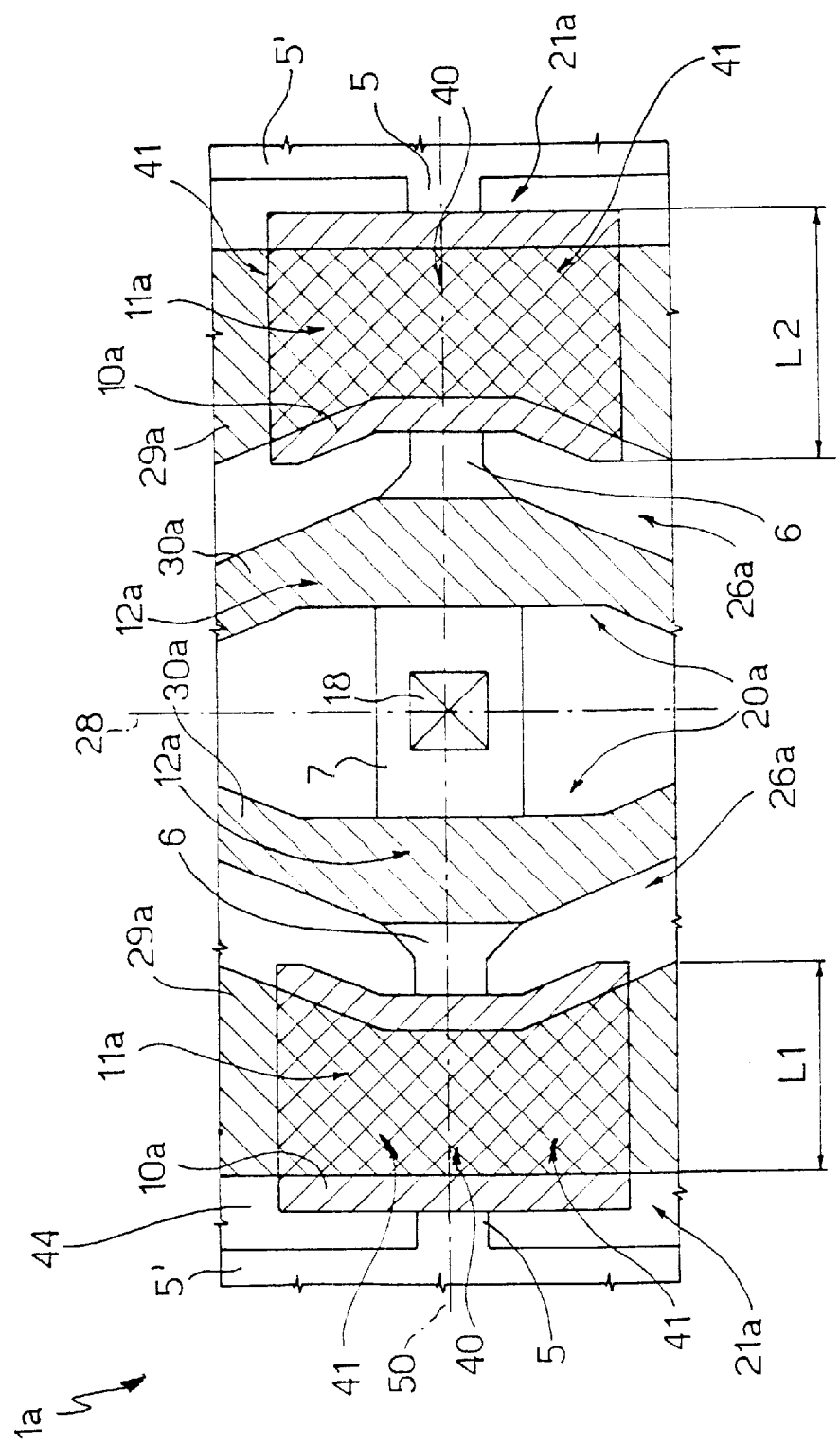
FIG. 3 shows a top view of a wafer incorporating a memory device according to the invention.

According to FIG. 3, concerning an embodiment of the invention, the width of the floating gate 10a and control gate 11a regions of the memory transistor 21, measured on different section planes parallel to the longitudinal section plane extending through axis 50 (section plane I—I), is not constant.

In detail, FIG. 3 shows a view similar to FIG. 2, for a memory device 1a according to the invention. For simplifying the comparison, in FIG. 3 the parts identical to FIG. 2 have been indicated by the same reference numeral and the corresponding parts have been marked with the same reference numeral followed by the letter a. Furthermore, it is stressed that the cross-section of FIG. 1 is also valid for the embodiment of FIG. 3.

According to FIG. 3, the dimension L1 of the control gate regions 11a is smallest in a central portion 40 and increases in lateral portions 41 (moving from the central portion 40 in a direction parallel to the transverse axis 28); specifically the dimension L1 is constant in the central portion 40 and increases linearly in the lateral portions 41, moving towards the adjacent cells (not shown) arranged over and under the memory portion 1a shown in FIG. 3. In this way, the first side of the control gate region 11a (facing towards the respective selection transistor 20) is not flat but is approximately C-shaped.

Similarly, in FIG. 3, the dimension L2 of the floating gate regions 10a, measured on section planes parallel to the longitudinal section plane extending through axis 50 (section plane of FIG. 1) is constant only in the central portion of the floating gate region 10a (arranged substantially under the central portion 40 of the control gate regions 11a) and then increases linearly in the end portions, except the last part thereof, to prevent the presence of tip regions. Here also, therefore, the first side of the floating gate regions 10a is not flat and is substantially C-shaped.

Vice versa, the second side of the control gate region 11a and of the floating gate region 10a of each memory transistor 21 (not facing towards the respective selection transistor 20) is flat and perpendicular to the longitudinal section plane extending through axis 50 (section plane of FIG. 1). In practice, in the top view, the control gate 11a and floating gate 10a regions form two approximately triangular fins facing respective selection gate region 12a; the fins are arranged in the regions of the gate regions overlying the field oxide 44 delimiting the source 5 and drain 6 regions (or in section planes before and behind the drawing plane, with respect to FIG. 1) to minimize short-circuit risks.

To prevent any risk of electrical contact between the strip 29a forming the control gate region 11a and the strip 30a forming the selection gate region 12a of a same memory cell 26a, the strip 30a is no longer straight but its side facing the respective memory transistor 21a is configured to have a substantially uniform distance from the strip 29a. Furthermore, the opposite side of the strip 29 (facing the selection transistor 12a of the symmetrical cell 26a) is not planar either, but is C-shaped, so that the width of the strip 29a is at least equal to a minimum value and hence the current capacity of that strip 29a is unchanged.

Therefore the overlap and capacitive coupling area between the control gate region 11a and the respective floating gate region 10a of the memory transistors 21a is greater than known memory device of the same type, shown in FIG. 2, while the distance between the control gate 11a and selection gate 12a regions remains the same.

Consequently, with the same total dimensions and programming voltage it is possible to achieve a greater programming efficiency or it is possible to reduce the programming voltage with the same threshold voltage and programming time.

The advantages of the above memory device are evident from the above.

It is emphasized, however, that the described modification of the geometry of the cells and thus the efficiency increase are obtained simply by suitably modifying the geometry of the masks used to form the floating gate region and the control gate region of the memory transistors and the selection gate region of the selection transistors, and thus without increased costs.

Finally it is clear that modifications and variants may be introduced to the memory device described and illustrated herein without departing from the scope of the invention as defined by the claims and equivalents thereof. In particular, although the description refers to EEPROM type memory cells, the invention may equally be applied to memory cells of a different type, such as flash cells, and/or to solutions of completely or partially self-aligned type.

What is claimed is:

1. A memory device, comprising:
    at least one first memory cell including a memory transistor;
    said memory transistor comprising a first and a second gate regions overlaid to each other and mutually insulated, said first and second gate regions being arranged over and insulated from a substrate of semiconductor material and a first conductivity type, said memory transistor further comprising a first and a second conductive regions of a second conductivity type both formed in said substrate respectively on a first and on a second side of said first and second gate regions;
    said first and second gate regions and said first and second conductive regions being mutually aligned along a longitudinal section plane;
    said second gate region having a non-constant width in different section planes parallel to said longitudinal section plane; and
    said first memory cell further comprises a selection transistor including a selection gate region; said selection gate region having a first and a second side, said first side of said selection gate region facing said first and second gate regions, and wherein the distance between said second gate region and said first side of said selection gate is approximately constant.

2. The memory device of claim 1 wherein said width of said second gate region is smallest in said longitudinal section plane and increases in successive parallel section planes moving away from said longitudinal section plane.

3. The memory device of claim 2 wherein said second gate region comprises a central portion and a pair of end portions moving in a direction perpendicular to said longitudinal section plane, said central portion of said second gate region having a constant width and said end portions having increasing width in successive parallel section planes moving away from said central portion.

4. The memory device of claim 3 wherein said end portions have a monotonically increasing width.

5. The memory device of claim 4 wherein said first side of said second gate region has a surface that is not flat and said second side of said second gate region has a flat surface.

6. The transistor of claim 2 wherein the first gate region is a floating gate and the second gate region is a control gate.

7. The memory device of claim 1, further comprising at least one second cell arranged specularly with respect to a transverse section plane.

8. The memory device of claim 1 wherein said second gate region has a width that is not constant in said parallel section planes.

9. The memory device of claim 8 wherein said width of said first gate region is smallest in said longitudinal section plane and increases in said parallel section planes moving away from said longitudinal section planes.

10. The memory device of claim 1 wherein said second side of said selection gate has a form that is not flat.

11. The memory device of claim 12 wherein said second side of said selection gate is approximately broken line-shaped and follows the profile of said first side of said selection gate.

12. A memory device, comprising:
    a memory transistor, comprising:
        a first gate formed over a substrate and insulated therefrom by a gate oxide, the first gate having a central portion with first and second end portions integrally formed with and depending from the central portion;
        the central portion having a rectangular plan-form shape with parallel first and second sides;
        the first and second end portions each having a first side that forms a substantially straight line with the first side of the central portion, and a second side that angles away from the second side of the central portion such that the first and second end portions have increasing widths at increasing distances from the central portion; and
        a second gate overlying the first gate and having a pair of sides that are substantially parallel to the underlying first and second sides of the central portion and first and second end portions of the first gate, the second gate having a width that is less than the width of the first gate throughout a length thereof; and
    a selection transistor including a selection gate region; said selection gate region having a first and a second side, said first side of said selection gate region facing said first and second gates, and wherein the distance between said second gate and said first side of said selection gate is approximately constant.

13. The transistor of claim 12 wherein the widths of the first and second end portions increase linearly.

14. A memory cell, comprising:
    a memory transistor having a first gate formed over a substrate, the first gate having a central portion with first and second end portions integrally formed with and depending from the central portion; the first and second end portions each having a first side that forms a substantially straight line with a first side of the central portion, and a second side that angles away from a second side of the central portion such that the first and second end portions have increasing widths at increasing distances from the central portion; and
    a selection transistor formed over the substrate adjacent the memory transistor and having a gate, the gate having first and second sides that are substantially parallel to the second side of the first gate of the memory transistor throughout a length thereof.

15. The memory cell of claim 14 wherein the selection transistor is formed adjacent the second side of the first gate of the memory transistor.

16. The memory cell of claim 15 wherein the memory transistor comprises a second gate overlying the first gate and having first and second sides that are substantially parallel to the underlying first and second sides of the central portion and first and second end portions of the first gate.

17. The memory cell of claim 16 wherein the second gate of the memory transistor has a width that is less than the width of the first gate of the memory transistor throughout a length thereof.

18. A memory device, comprising:
    a memory transistor having a floating gate formed over a substrate and a control gate formed over the floating gate, the floating gate having a central portion with first and second end portions integrally formed with and depending from the central portion, the central portion having a rectangular plan-form shape with parallel first and second sides, and the first and second end portions each having a first side that forms a substantially straight line with the- first side of the central portion, and a second side that angles away from the second side of the central portion such that the first and second end portions have increasing widths at increasing distances from the central portion, the control gate overlying the floating gate and having a pair of sides that are substantially parallel to the underlying first and second sides of the central portion of the first and second end portions of the floating gate, the control gate having a width that is less than the width of the floating gate throughout the length thereof; and
    a selection transistor having a selection gate region, the selection gate region having a first and a second side, the first side of the selection gate region facing the floating gate and control gate of the memory transistor, and wherein the distance between the floating gate of the memory transistor and the selection gate region of the selection transistor is shorter than the distance between the control gate of the memory transistor and the selection gate region of the selection transistor.

* * * * *

UNITED STATES PATENT AND TRADEMARK OFFICE
CERTIFICATE OF CORRECTION

PATENT NO. : 6,414,349 B1
DATED : July 2, 2002
INVENTOR(S) : Giovanna Dalla Libera et al.

It is certified that error appears in the above-identified patent and that said Letters Patent is hereby corrected as shown below:

Column 5,
Line 13, "The memory device of claim 12" should read as -- The memory device of claim 10 --.

Signed and Sealed this

Twenty-ninth Day of October, 2002

Attest:

JAMES E. ROGAN
Attesting Officer   Director of the United States Patent and Trademark Office